United States Patent
Vest

[11] 3,956,720
[45] May 11, 1976

[54] STORAGE BATTERY ANALYZER

[76] Inventor: Gary W. Vest, 4480 Broadview Road, Cleveland, Ohio 44109

[22] Filed: Oct. 4, 1974

[21] Appl. No.: 512,208

[52] U.S. Cl. .............................. 324/29.5; 136/182; 320/48; 340/249
[51] Int. Cl.² .................. G01N 27/30; G01N 27/46
[58] Field of Search .................. 136/182; 324/29.5; 340/249; 320/48

[56] References Cited
UNITED STATES PATENTS

| | | | |
|---|---|---|---|
| 2,922,104 | 1/1960 | Godshalk et al. | 324/29.5 |
| 3,060,374 | 10/1962 | Strain | 324/29.5 |
| 3,349,322 | 10/1967 | Lowe | 324/29.5 |
| 3,879,654 | 4/1975 | Kessinger | 324/29.5 |

FOREIGN PATENTS OR APPLICATIONS

| 783,727 | 4/1968 | Canada | 324/29.5 |
|---|---|---|---|

*Primary Examiner*—John Kominski
*Attorney, Agent, or Firm*—Bosworth, Sessions & McCoy

[57] ABSTRACT

An instrument for measuring and testing wet cell storage battery charge levels including the total charge level and the charge level of individual cells. The instrument has an autopolarity feature and utilizes a diode rectifier circuit with a DC voltmeter connected across the terminals. Separate circuits may be selected to provide two voltage readout scales including a scale for measuring the total charge level and a scale for measuring the charge of individual cells. The device has unique conductive probes at the ends of the test leads, the probes being adapted for immersion in the electrolyte of the cells in order to measure the charge level of individual cells. The probes are also used to provide electrical contact across the battery terminals for the total charge test. The probes are elongated steel rods coated with cadmium plating and having the outer ends ground off so that a roughened steel end surface is exposed to the electrolyte.

5 Claims, 4 Drawing Figures

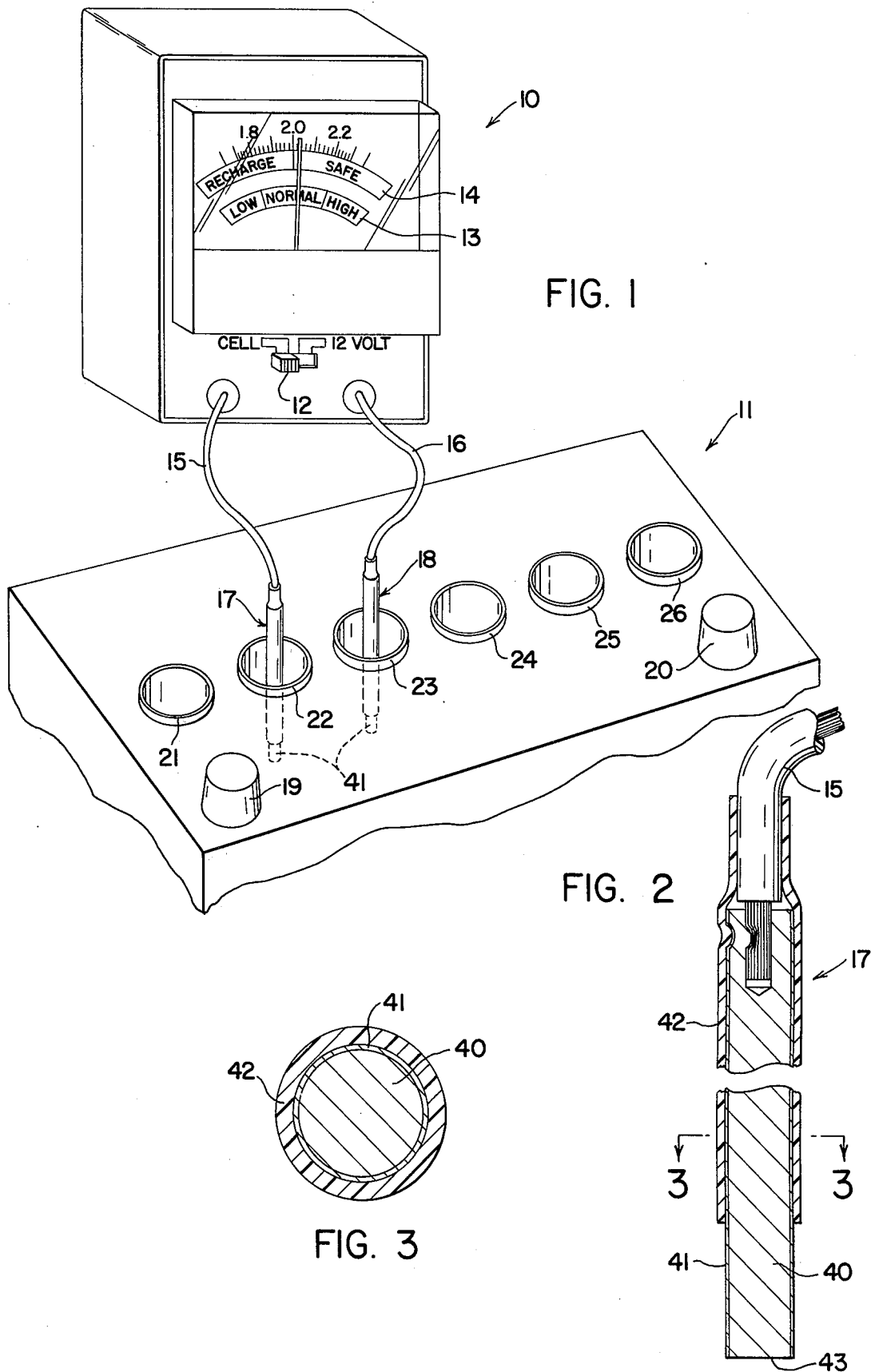

STORAGE BATTERY ANALYZER

BACKGROUND OF THE INVENTION

This invention relates to devices for measuring and testing wet cell storage batteries to measure the total charge level as well as the charge level of individual cells, and especially to a device with a voltmeter having circuitry for dual range readout and with conductive probes adapted to be immersed in the electrolyte of the individual battery cells. More particularly the invention relates to a unique and particularly advantageous construction for the test probes to be immersed in the electrolyte, whereby the electrical contact between the probes and the electrolyte provides a steady, uniform, reliable flow of current during testing over an extended span of use.

Where conductive leads for wet cell storage battery testing instruments are used to measure the charge level of individual cells, the probes at the ends of the leads must be dipped in the electrolyte. This presents special and unique problems due to the chemical effect of the acid solution on most electrically conductive metals. For example, the acid solution corrodes many metals and also causes in some instances polarization after a short period of use with resulting unreliable meter readings. Also the probes must be fabricated of a metal which can be readily connected with sound electrical contact to the flexible test leads which are usually stranded wire conductors.

Some conductive metals such as ferrous metals corrode quickly due to acid action. When steel probes are immersed in the electrolyte the acid eats through the first layer of impurities on the surface of the metal in several seconds and during that time the variation in current flow prevents accurate readings. Steel probes, however, do not polarize and for that reason are effective after the initial chemical action subsides. Over a period of time, however, steel probes rust and become unsuitable, also, steel probes after use must be placed in a neutralizing solution such as baking soda to stop the corrosive effect of the acid.

Probes formed of pure nickel also tend to give a variable readout during the first several seconds of their immersion in the electrolyte and additionally they become polarized after about ten seconds.

Pure cadmium test probes also give an inaccurate variable reading for the first several minutes of their immersion or longer and when the acid action stabilizes they provide a reading voltage unpredictably lower than the actual voltage probably due to polarization. Also, the cost of pure cadmium is prohibitively high for most applications.

Cadmium plated steel probes are suitable in many respects but have a slight drift due to polarization in inaccurate readings due to a progressive drop in current flow. Accordingly, satisfactory conductive probes for storage battery testing instruments have not been obtainable in the prior art since known conductive metals and combinations thereof have inherent deficiencies that have prevented optimum utilization of the instrument's capabilities.

The present invention, however, reduces the difficulties and deficiencies indicated above and affords other features and advantages heretofore not obtainable.

SUMMARY OF THE INVENTION

It is among the objects of the invention to provide more accurate voltage readings in wet cell battery test instruments and to afford optimum utilization of the capabilities of the meter.

Another object of the invention is to provide a conductive test probe construction for a wet cell storage battery testing instrument that provides stable accurate readings when immersed in an electrolyte solution.

Still another object is to provide a conductive test probe construction for use in association with a wet cell storage battery voltage measuring instrument, that will provide accurate readings over a long period of use and will have a minimum susceptibility to corrosion from the acid action of an electrolyte in the battery cells.

These and other objects are achieved by the unique conductive test probe construction of the invention which is adapted for use in association with a wet cell storage battery voltage measuring device that utilizes an auto-polarity rectifier circuit and a DC voltmeter. Preferably the instrument has a dual range capability for reading both the total charge level across the battery terminals and the charge level of the individual cells. The instrument has a pair of flexible test leads with conductive probes on the ends thereof which are adapted for use both in providing electrical contact with the respective terminals of the battery and also for immersion in the electrolyte to provide electrical contact for reading the charge level of individual battery cells. The probes each comprise an elongated steel rod having its longitudinal side surfaces plated with cadmium and having its outer end ground off to expose a porous end surface portion of the steel rod. While the steel is eroded away within the layer of cadmium plating over an extended period of use the probes may be periodically ground off at the ends to renew the exposed end surface.

BRIEF DESCRIPTION OF THE DRAWINGS

FIG. 1 is a fragmentary perspective view illustrating a wet cell storage battery voltage measuring instrument and showing the conductive probes of the instrument immersed in the electrolyte of adjacent battery cells;

FIG. 2 is a fragmentary sectional view illustrating the construction of a conductive test probe for the instrument of FIG. 1 and embodying the invention;

FIG. 3 is a transverse sectional view taken on the line 3—3 of FIG. 2; and

DESCRIPTION OF THE PREFERRED EMBODIMENT

Figure 4:
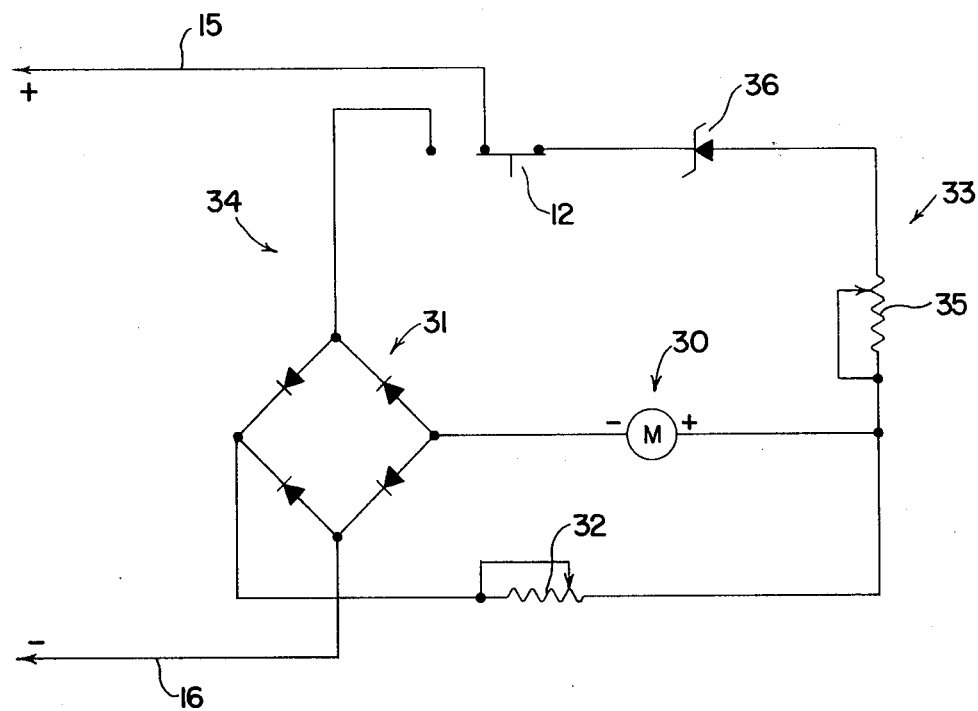
FIG. 4 is an electrical schematic diagram illustrating typical circuitry for a wet cell storage battery measuring instrument of the type illustrated in FIG. 1.

Referring more particularly to the drawings and initially to FIG. 1 there is shown an instrument 10 for testing the total charge level and individual cell voltage level of a wet cell storage battery 11. The instrument 10 has a selector switch 12 that is used to select the correct voltage range circuit for one of two scales including a total charge level scale 13 and an individual cell voltage level scale 14. The individual cell voltage level scale 14 is calibrated over a range expanded from 1.8 to 2.2 volts whereas the total battery charge level scale 13 is calibrated to read in a range from 11 to 13 volts. A pair of flexible test leads 15 and 16 with conductive probes 17 and 18 at their outer ends, are used to provide electrical contact between either the battery terminals 19 and 20 or with the electrolyte in adjacent cells of the battery to which access may be obtained through six battery cell filler ports 21, 22, 23, 24, 25 and 26.

The probes 17 and 18 are constructed in accordance with the invention and are illustrated in FIG. 1 immersed in the electrolyte of two adjacent battery cells through the ports 22 and 23 respectively. The unique construction of the probes 17 and 18 will be described in detail below.

Referring to FIG. 4 there is shown an electrical schematic diagram of the instrument 10. The instrument has a voltmeter 20 adapted to measure and indicate potential difference between the test leads. The instrument has two branch circuits including an individual cell voltage level branch 33 and a total battery charge level branch 34, the branches 33 and 34 being selectively activated by the selector switch 12. The branch 33 has a 500 ohm variable resistor 32 for calibrating the meter relative to the scale 14. A diode bridge 31 in the branch 33 provides an auto-polarity feature for the instrument when used in testing individual cells and also limits the voltage across the meter 20 thereby allowing an expanded indication on the scale 14 over the range of 1.8 to 2.2 volts. The branch 34 includes a 500 ohm variable resistor 35 for calibrating the meter relative to the scale 14 and also a zener diode 36 (10.5 v, 400 MW) to limit the voltage across the meter 20 to the desired range when the branch 34 is actuated as will be readily apparent to those skilled in the art.

FIGS. 2 and 3 illustrate the unique construction of the probes 17 and 18 for the test leads 15 and 16. Since the construction of the probes 17 and 18 is essentially identical the following description will be limited to the construction of the test probe 18. The probe 18 comprises an elongated length of steel rod 40 electrically connected at its outer end to the electrical conductors of the test lead 16. The connection may be made by soldering or as illustrated in FIG. 2, by crimping the conductors of the flexible leads 16 in an axial hole in the end of the rod 40. The rod has a layer of cadmium plating 41 applied and has a major length portion thereof encased in a suitable insulating material 42.

In accordance with the invention, after the plating is accomplished using techniques well known in the art, the end of the resulting product is cut off such as by shearing to remove any cadmium plating that forms on the end of the rod to expose the steel end face 43. Thus the steel end face 43 which is generally rough and porous due to the shearing action, is exposed to the electrolyte when the probe 18 is inserted in a cell for accomplishing the cell test.

The result of this unique construction is that the instrument provides a visual meter reading which remains steady, uniform and accurate, free from any tendency to drift. It is believed that these unexpected results are achieved because the exposed steel end face 43 of the probe makes good electrical contact with the electrolyte at the outset even though the electrical contact between the cadmium plating and the electrolyte may vary slightly for the initial period of immersion due to chemical action.

After an extended period use, the end face 43 of the probe 18 may erode forming an end cavity. This may be corrected by renewing the end of the probe 18 by cutting off a short end portion. Thus the resulting probe will be effective through an extended period of use, usually throughout the life expectancy of the instrument itself. In the embodiment shown, the meter 10 is a 10 milliamp (full scale) 75 ohm voltmeter readily available commercially.

While the invention has been shown and described with respect to a preferred embodiment thereof other modifications and variations in the specific embodiment herein shown and described will be apparent to those skilled in the art all within the intended spirit and scope of the invention. Accordingly, the patent is not to be limited in scope and effect to the specific embodiment herein shown and described nor in any other way that is inconsistent with the extent to which the progress in the art has been advanced by the invention.

I claim:

1. In an instrument for measuring and indicating a storage battery charge level and for indicating potential difference between adjacent battery cells, the instrument including a pair of electrical conductive leads adapted to be immersed in the electrolyte of said adjacent cells, the improvement which comprises:
   conductive probes connected at the end of each lead each probe comprising:
   an elongated conductive steel element having one end connected to one of said leads, and
   a layer of cadmium plating over the side surfaces of said element,
   the outer end face of said element being exposed for contact with said electrolyte solution.

2. An instrument probe as defined in claim 1 wherein said outer end face is formed by cutting off the end of a plated rod wherein cadmium plating initially covers the end of the rod as a result of the plating process.

3. An instrument as defined in claim 1 wherein said instrument has a voltmeter, two branch circuits, selectively connectable to said voltmeter and means for selecting one of said branch circuits to selectively measure one of two voltage ranges.

4. An instrument as defined in claim 3 wherein one of said branch circuits has a diode bridge to provide auto-polarity and to limit the voltage across said meter to a desired voltage range.

5. An instrument as defined in claim 3 wherein one of said circuits has a zener diode to limit the voltage across said meter to a desired voltage range.

* * * * *